United States Patent
Vadlamani et al.

(10) Patent No.: US 11,244,912 B2
(45) Date of Patent: Feb. 8, 2022

(54) SEMICONDUCTOR PACKAGE HAVING A COAXIAL FIRST LAYER INTERCONNECT

(71) Applicant: Intel Corporation, Santa Clara, CA (US)

(72) Inventors: Sai Vadlamani, Chandler, AZ (US);
Aleksandar Aleksov, Chandler, AZ (US); Rahul Jain, Gilbert, AZ (US);
Kyu Oh Lee, Chandler, AZ (US);
Kristof Kuwawi Darmawikarta, Chandler, AZ (US); Robert Alan May, Chandler, AZ (US); Sri Ranga Sai Boyapati, Chandler, AZ (US);
Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/481,385

(22) PCT Filed: Mar. 30, 2017

(86) PCT No.: PCT/US2017/025199
§ 371 (c)(1),
(2) Date: Jul. 26, 2019

(87) PCT Pub. No.: WO2018/182652
PCT Pub. Date: Oct. 4, 2018

(65) Prior Publication Data
US 2020/0168569 A1    May 28, 2020

(51) Int. Cl.
*H01L 21/48*    (2006.01)
*H01L 23/66*    (2006.01)
(Continued)

(52) U.S. Cl.
CPC .......... *H01L 23/66* (2013.01); *H01L 21/4857* (2013.01); *H01L 23/49816* (2013.01);
(Continued)

(58) Field of Classification Search
CPC ................. H01L 23/66; H01L 21/4857; H01L 23/49816; H01L 23/49894; H01L 24/81
See application file for complete search history.

(56) References Cited

U.S. PATENT DOCUMENTS 5,347,086 A * 9/1994 Potter ..................... H01L 24/13
174/261
6,388,198 B1 * 5/2002 Bertin ..................... H01L 21/84
174/251
(Continued)

FOREIGN PATENT DOCUMENTS

WO    WO-2016-007706    1/2016

OTHER PUBLICATIONS

International Preliminary Report on Patentability for International Patent Application No. PCT/US2017/025199, dated Oct. 10, 2019, 11 pages.
(Continued)

*Primary Examiner* — Fernando L Toledo
*Assistant Examiner* — Valerie N Newton
(74) *Attorney, Agent, or Firm* — Schwabe, Williamson & Wyatt, P.C.

(57) ABSTRACT

Semiconductor packages having a first layer interconnect portion that includes a coaxial interconnect between a die and a package substrate are described. In an example, the package substrate includes a substrate-side coaxial interconnect electrically connected to a signal line. The die is mounted on the package substrate and includes a die-side coaxial interconnect coupled to the substrate-side coaxial interconnect. The coaxial interconnects can be joined by a
(Continued)

solder bond between respective central conductors and shield conductors.

20 Claims, 9 Drawing Sheets

(51) Int. Cl.
*H01L 23/498* (2006.01)
*H01L 23/00* (2006.01)

(52) U.S. Cl.
CPC ........ *H01L 23/49894* (2013.01); *H01L 24/81* (2013.01); *H01L 2223/6611* (2013.01); *H01L 2224/81359* (2013.01)

(56) References Cited

U.S. PATENT DOCUMENTS

| | | |
|---|---|---|
| 9,368,440 B1 | 6/2016 | Hool |
| 2004/0245610 A1 | 12/2004 | Zhong et al. |
| 2012/0045909 A1 | 2/2012 | Pischler |
| 2012/0313226 A1* | 12/2012 | Koizumi ................ H01L 24/19 257/659 |
| 2013/0189812 A1 | 7/2013 | Roy et al. |
| 2016/0163628 A1* | 6/2016 | We ........................ H01L 23/66 257/664 |

OTHER PUBLICATIONS

International Search Report and Written Opinion for International Patent Application No. PCT/US2017/025199 dated Dec. 28, 2017, 14 pgs.

\* cited by examiner

SEMICONDUCTOR PACKAGE HAVING A COAXIAL FIRST LAYER INTERCONNECT

CROSS-REFERENCE TO RELATED APPLICATION

This patent application is a U.S. National Phase Application under 35 U.S.C. § 371 of International Application No. PCT/US2017/025199, filed Mar. 30, 2017, entitled "SEMICONDUCTOR PACKAGE HAVING A COAXIAL FIRST LAYER INTERCONNECT," which designates the United States of America, the entire disclosure of which is hereby incorporated by reference in its entirety and for all purposes.

FIELD OF THE INVENTION

Embodiments are in the field of integrated circuit packages and, in particular, semiconductor packages including a first layer interconnect between a die and a package substrate.

BACKGROUND OF THE INVENTION

Semiconductor packages typically include a die mounted on a top surface of a package substrate. Data signals can be communicated between the die and signal lines buried in the package substrate through vertical I/O structures passing between the die and the package substrate. The vertical I/O structures may typically include singular metallic strands, e.g., wire bonds, copper pillars, etc. Such vertical I/O structures can reliably reach data transfer rates of 8-10 Gbit/sec.

DETAILED DESCRIPTION OF THE INVENTION

Semiconductor packages having a first layer interconnect portion that includes a coaxial interconnect between a die and a package substrate are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

Existing vertical I/O structures may not provide reliable data transfer at high bandwidths. For example, at data transfer rates above 10 Gbit/sec, a singular wire bond or copper pillar can suffer substantial signal loss, which degrades signal reliability of the semiconductor package. Advances in signal lines buried in the package substrate have made data transfer rates upwards of 100 Gbit/sec per interconnect possible, however. Accordingly, to recognize the full benefit of advances in die-to-die interconnect architectures, improvements in die-to-substrate interconnect architectures may be needed.

In an aspect, a first layer interconnect (FLI) portion of a semiconductor package, i.e., an actual interconnect from a die to a package substrate, includes a coaxial interconnect having a central conductor surrounded by a shield conductor. The coaxial structure can extend from a buried signal line in the package substrate through a top layer of the package substrate in a vertical direction to a semiconductor layer of the die. The coaxial structure can carry a data signal from the signal line and enable ground isolation of the data signal to reduce signal loss. Accordingly, the coaxial FLI can enable reliable data transfer at bandwidths of at least one order of magnitude higher than conventional vertical I/O structures, e.g., data transfer rates in a range of 100-120 Gbit/sec.

Semiconductor packages incorporating advanced signal line architectures and the coaxial FLI architecture described below can allow the use of established package dimensions and manufacturing infrastructure and processes while allowing for bandwidths sufficient to enable tiling of dies. That is, conventional monolithic integrated silicon dies can be sub-divided into several tiled dies interconnected on a package substrate by high bandwidth interconnects. Such tiling can make optimal use of silicon process node technology and increase manufacturing yields of silicon wafers.

Figure 1:
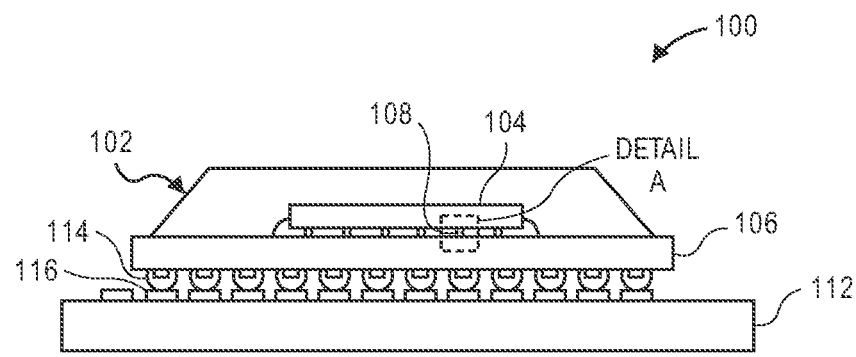
FIG. 1 illustrates a sectional view of a semiconductor package assembly, in accordance with an embodiment.

Referring to FIG. 1, a sectional view of a semiconductor package assembly is illustrated in accordance with an embodiment. A semiconductor package assembly 100 may include one or more semiconductor packages 102 having integrated dies in communication with each other or other components of the assembly. In an embodiment, semiconductor package 102 is a system having a semiconductor die 104, e.g., a memory die, mounted on a package substrate 106. Semiconductor die 104 may be connected to other dies and to conductive components, e.g., signal lines, of package substrate 106 by electrical interconnects. The electrical interconnects may be, for example, a first layer interconnect (FLI) 108 between die 104 and package substrate 106.

In an embodiment, package substrate 106 may be mounted on a circuit board 112. For example, semiconductor package 102 of semiconductor package assembly 100 may be a ball grid array (BGA) component having several solder balls 114 arranged in a ball field. That is, an array of solder balls 114 may be arranged in a grid or other pattern. Each solder ball 114 may be mounted and attached to a corresponding contact pad 116 of circuit board 112. Solder balls 114 and contact pads 116 may be electrically connected by electrical interconnects extending over or through circuit board 112, as is known in the art. Circuit board 112 may be a motherboard or another printed circuit board of a computer system or device. Circuit board 112 may include signal routing to external device connectors (not shown). Accordingly, the solder ball and contact pad attachments may provide a physical and electrical interface between the die 104 of semiconductor package 102 and an external device.

Figure 2:
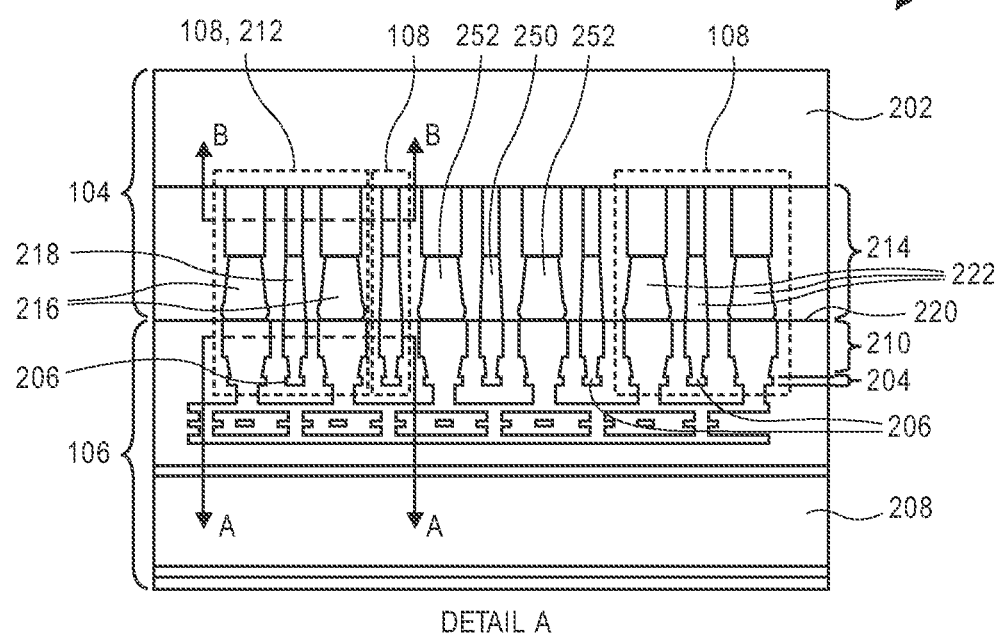
FIG. 2 illustrates a detail view, taken from Detail A of FIG. 1, of a first layer interconnect (FLI) portion of a semiconductor package, in accordance with an embodiment.

Referring to FIG. 2, a detail view, taken from Detail A of FIG. 1, of a first layer interconnect (FLI) portion of a semiconductor package is shown in accordance with an embodiment. An FLI portion 200 of semiconductor package 102 includes one or more FLI 108 extending between a semiconductor layer 202 of die 104 and a signal routing layer 204 of package substrate 106. That is, FLI portion 200 includes chip-to-package interconnects of semiconductor package 102. Data transfer rates of the chip-to-package interconnects can be maximized by insulating a signal passing through FLI 108 to minimize signal loss, as described below.

Signal routing layer 204 may include a signal line 206 extending laterally through package substrate 106. For example, package substrate 106 may include a dielectric layer 208, e.g., a core layer, and signal line 206 may extend through package substrate 106 parallel to a plane of dielectric layer 208. In FIG. 2, using the sheet face as a reference, signal line 206 may pass into the page. Signal line 206 can be a portion of an advanced I/O line used for die-to-die stitching. For example, signal line 206 may be a portion of a special waveguide structure used as a chip-to-chip interconnect. More particularly, signal line 206 may be a portion of coaxial routing that extends laterally beneath a substrate-side top layer 210 of package substrate 106. Top layer 210 may be a solder resist layer signal line 206 may carry a signal below the solder resist surface of package substrate 106. Coaxial routing can be achieved with current substrate package manufacturing capabilities and dimensions, and can reach data transfer rates of 1.2 Tbit/sec per mm of die width. Thus, high bandwidth can be achieved with 10-12 signal lines per mm running laterally within signal routing layer 204.

FLIs 108 of semiconductor package 102 can extend vertically from respective signal lines 206. For example, FLIs 108 can include a coaxial interconnect 212 electrically connected to signal line 206 and extending upward from signal routing layer 204 through substrate-side top layer 210 and a die-side top layer 214 to semiconductor layer 202 of die 104. More particularly, coaxial interconnect 212 may include a shield conductor 216 surrounding a central conductor 218, and both shield conductor 216 and central conductor 218 may extend coaxially between signal routing layer 204 and semiconductor layer 202. Accordingly, central conductor 218 and shield conductor 216 may extend orthogonal to dielectric layer 208.

In an embodiment, the vertical structure of coaxial interconnect 212 has portions within die 104 and package substrate 106. For example, substrate-side top layer 210 may extend over signal routing layer 204, and coaxial interconnect 212 may extend through substrate-side top layer 210 to a top surface 220 of package substrate 106. At top surface 220, coaxial interconnect 212 may transition into a solder bump 222 between coaxial interconnect 212 in package substrate 106 and coaxial interconnect 212 in die 104. More particularly, solder bumps 222 may be on top surface 220 to join segments of coaxial interconnect 212 within substrate-side top layer 210 to segments of coaxial interconnect 212 within die-side top layer 214.

Figures 3, 4:
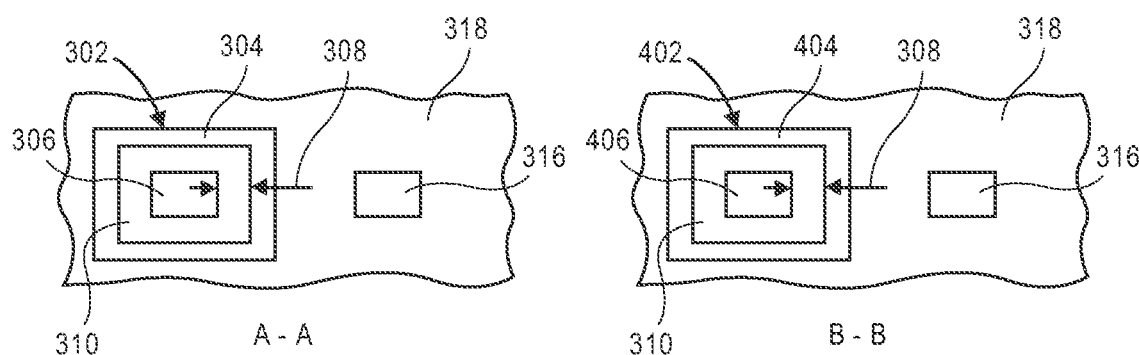
FIG. 3 illustrates a sectional view, taken about line A-A of FIG. 2, of a substrate-side coaxial interconnect, in accordance with an embodiment.
FIG. 4 illustrates a sectional view, taken about line B-B of FIG. 2, of a die-side coaxial interconnect, in accordance with an embodiment.

Referring to FIG. 3, a sectional view, taken about line A-A of FIG. 2, of a substrate-side coaxial interconnect is shown in accordance with an embodiment. Segments of coaxial interconnect 212 within substrate-side top layer 210 may form a substrate-side coaxial interconnect 302. Substrate-side coaxial interconnect 302 can extend vertically through substrate-side top layer 210, and can have a coaxial configuration. More particularly, substrate-side coaxial interconnect 302 can include a substrate-side shield conductor 304 surrounding a substrate-side central conductor 306. Substrate-side central conductor 306 and substrate-side shield conductor 304 may be concentric. That is, the coaxial central and shield conductors 304, 306 can share a same central axis that extends orthogonal to signal routing layer 204 of package substrate 106. The concentricity of the central conductor 306 and the shield conductor 304 may also be expressed in terms of the relationship between respective cross-sectional areas of the conductors. The central conductor 306 and the shield conductor 304 may have respective cross-sectional areas having respective shapes, e.g., circular or polygonal, and the shapes may be concentric, i.e., concentric shapes.

An outer surface of substrate-side central conductor 306 may be separated from an inner surface of substrate-side shield conductor 304 by a gap 308. In an embodiment, a signal insulation material 310 fills gap 308 between central conductor 218 and shield conductor 216 of coaxial interconnect 212. That is, signal insulation material 310 can separate substrate-side central conductor 306 from substrate-side shield conductor 304. Central conductor 218 and shield conductor 216 of coaxial interconnect 212 can be formed from copper such that, during operation, substrate-side central conductor 306 can carry a data signal and substrate-side shield conductor 304 can be maintained at a ground potential. Thus, electric and magnetic fields from the data signal may be restricted to the gap region of coaxial interconnect 212, and there may be essentially no signal loss even at data transfer rates above 100 Gbit/sec.

Substrate-side coaxial interconnect 302 can be distinguished from FLI 108 that does not have a coaxial arrangement. For example, FLI 108 may include a via 316 extending between semiconductor layer 202 and signal routing layer 204. Via 316 may be surrounded by a dielectric material 318, which may be a same or different material than signal insulation material 310 between the coaxial conductors. As an example, signal insulation material 310 and/or dielectric material 318 may be an insulating adhesive such as an underfill material, a buildup film, or a solder resist film. Signal insulation material 310 and/or dielectric material 318 may also be an epoxy-based material or an acrylic polymer, by way of example.

Referring to FIG. 4, a sectional view, taken about line B-B of FIG. 2, of a die-side coaxial interconnect is shown in accordance with an embodiment. Segments of coaxial interconnect 212 within die-side top layer 214 form a die-side coaxial interconnect 402. Die-side coaxial interconnect 402 may extend orthogonal to semiconductor layer 202 of die 104. Die-side coaxial interconnect 402 can extend vertically through die-side top layer 214, and can have a coaxial configuration. More particularly, die-side coaxial interconnect 402 can include a die-side shield conductor 404 surrounding a die-side central conductor 406. Die-side central conductor 406 and die-side shield conductor 404 may be concentric. That is, the coaxial central and shield conductors 216 can share a same central axis that extends orthogonal to semiconductor layer 202 of die 104.

An outer surface of die-side central conductor 406 may be separated from an inner surface of die-side shield conductor 404 by gap 308. In an embodiment, signal insulation material 310 fills gap 308 between central conductor 218 and shield conductor 216 of coaxial interconnect 212. That is, signal insulation material 310 can separate die-side central conductor 406 from die-side shield conductor 404. Central conductor 218 and shield conductor 216 of coaxial interconnect 212 can be formed from copper such that, during operation, die-side central conductor 406 can carry a data signal and die-side shield conductor 404 can be maintained at a ground potential. Thus, electric and magnetic fields from the data signal may be restricted to the gap 308 region of coaxial interconnect 212, and there may be essentially no signal loss even at data transfer rates above 100 Gbit/sec.

Die-side coaxial interconnect 402 can be spaced apart from via 316 extending between semiconductor layer 202 and signal routing layer 204. Via 316 may be surrounded by dielectric material 318. It can be seen then, that substrate-side coaxial interconnect 302 along line A-A may have a profile matching a profile of die-side coaxial interconnect 402 along line B-B. Accordingly, substrate-side coaxial interconnect 302 can be aligned with die-side coaxial interconnect 402. Die-side coaxial interconnect 402 may be coupled, e.g., by solder bump 222, to substrate-side coaxial interconnect 302 to form coaxial interconnect 212 between die 104 and package substrate 106. For example, substrate-side shield conductor 304 may be coupled to die-side shield conductor 404 by a respective annular-shaped solder joint, and substrate-side central conductor 306 may be coupled to die-side central conductor 406 by a respective central solder joint 250 (FIG. 2). Central solder joint 250 may be located between the central conductor 218 segments within die-side top layer 214 and substrate-side top layer 210, the and shield solder joint 252 may be between the shield conductors 216 within die-side top layer 214 and substrate-side top layer 210.

The coaxial configuration of central conductor 218 and shield conductor 216 of coaxial interconnect 212 can include various geometries. For example, the tubular shield conductor 216 as described above can have an annular cross-sectional area, e.g., rectangular, circular, etc., having an inner dimension and an outer dimensions. The solid cross-sectional area of central conductor 218 can match the inner dimension of the tubular shield conductor 216. For example, the cross-sectional area of central conductor 218 may be rectangular, circular, etc. In an embodiment, gap 308 is constant around a perimeter of coaxial interconnect 212. That is, a distance between an outer surface of central conductor 218 and an inner surface of shield conductor 216 may be the same at all angular positions about coaxial interconnect 212. Alternatively, gap 308 may vary. For example, the tubular shield conductor 216 may have a cross-sectional area of a first shape, e.g., a rectangular annulus, and central conductor 218 may have a cross-sectional area of a second shape, e.g., a circular area. When the first and second shape are mismatched, the gap 308 distance may vary. In any case, electrical and magnetic fields generated by data signals carried within central conductor 218 may be restricted to gap 308, while shield conductor 216 is maintained at a ground potential to allow ground isolation of the data signal and no signal loss.

Figure 5:
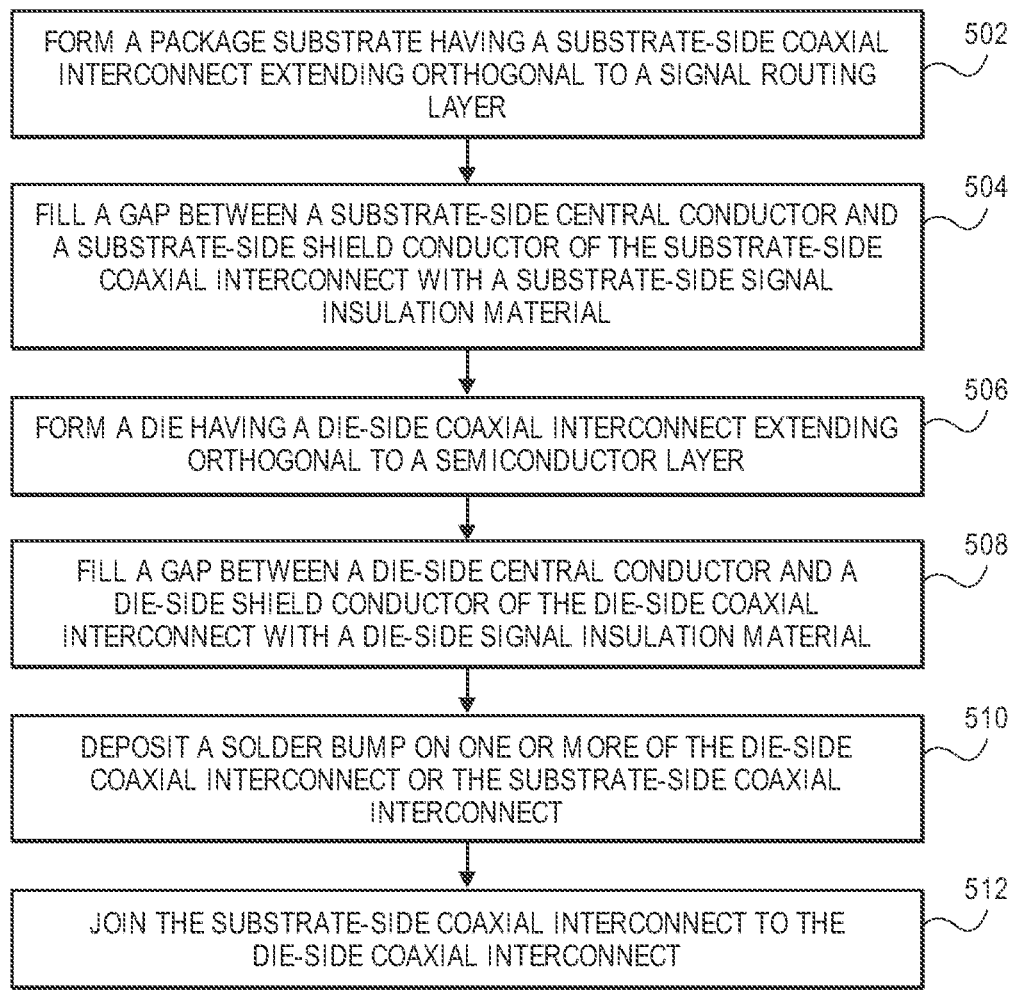
FIG. 5 illustrates a method of manufacturing a semiconductor package having a coaxial interconnect in an FLI portion, in accordance with an embodiment.

Referring to FIG. 5, a method of manufacturing a semiconductor package having a coaxial interconnect in an FLI portion is shown in accordance with an embodiment. FIGS. 6A-6H illustrate operations in the method of FIG. 5. Accordingly, FIGS. 5-6H are described in combination below.

At operation 502, package substrate 106 having substrate-side coaxial interconnect 302 is formed. Substrate-side coaxial interconnect 302 can extend orthogonal to signal routing layer 204 of package substrate 106. Operation 502 can be realized using numerous sub-operations, several of which are illustrated in FIGS. 6A-6B.

Figure 6A:
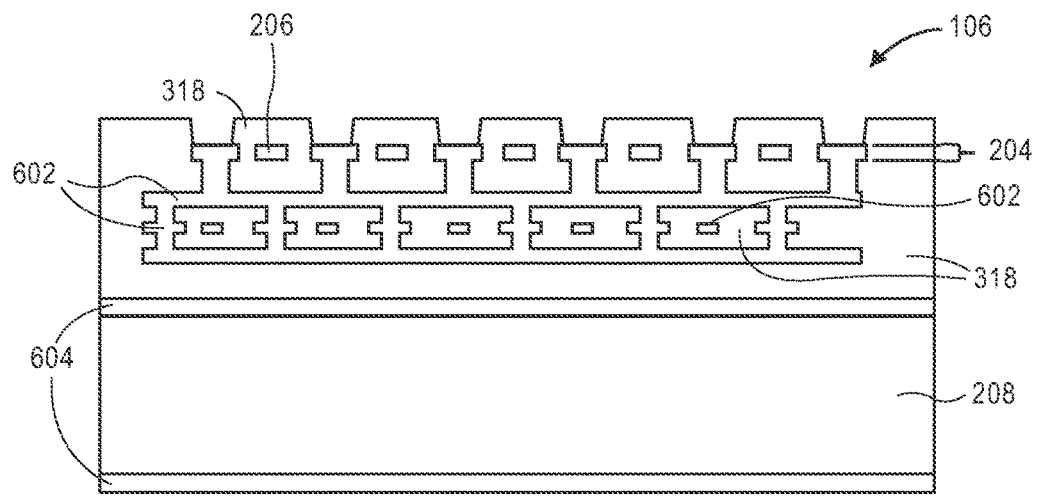
FIGS. 6A-6H illustrate operations in a method of manufacturing a semiconductor package having a coaxial interconnect in an FLI portion, in accordance with an embodiment.

Referring to FIG. 6A, package substrate 106 can be fabricated using known processes to build a laminate structure having several electrical traces 602 electrically insulated from each other by a surrounding dielectric material 318. Some of the electrical traces 602 may be located within signal routing layer 204 which can include waveguide interconnects as described above, e.g., signal line 206. The laminate structure can be formed over dielectric layer 208 which can be separated from a top side and bottom side laminate structure by intervening copper layers 604.

Figure 6B:
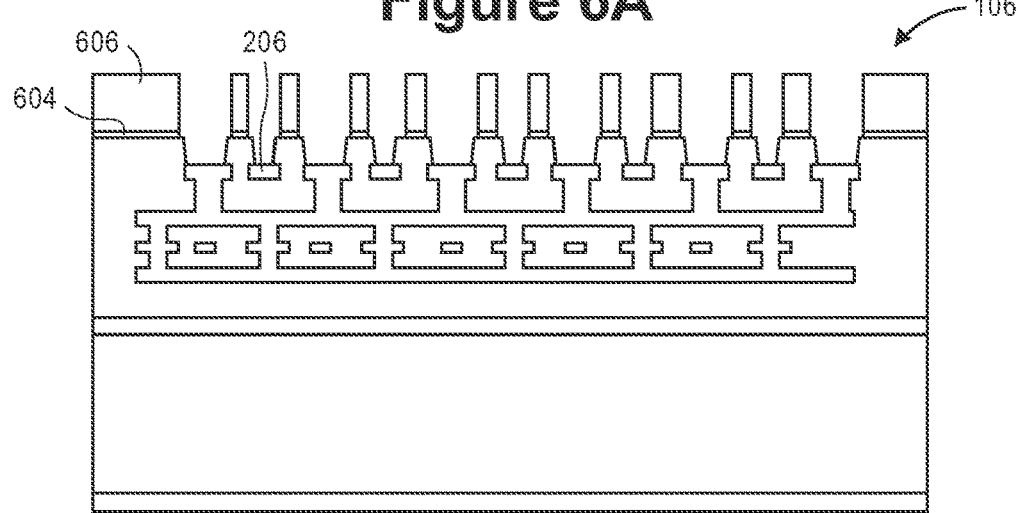

Referring to FIG. 6B, signal line 206 can be exposed by laser drilling through an insulating material, e.g., dielectric material 318, that covers signal line 206 in FIG. 6A. The laser drilling can expose the copper signal lines 206 within signal routing layer 204 that are used to carry the data signals for I/O function. An additional copper layer 604 may be deposited, e.g., by electroless copper deposition, and a dry film resist (DFR) layer 606 can be formed over the copper layer 604. DFR layer 606 may include vertical channels over signal line 206.

Figure 6C:
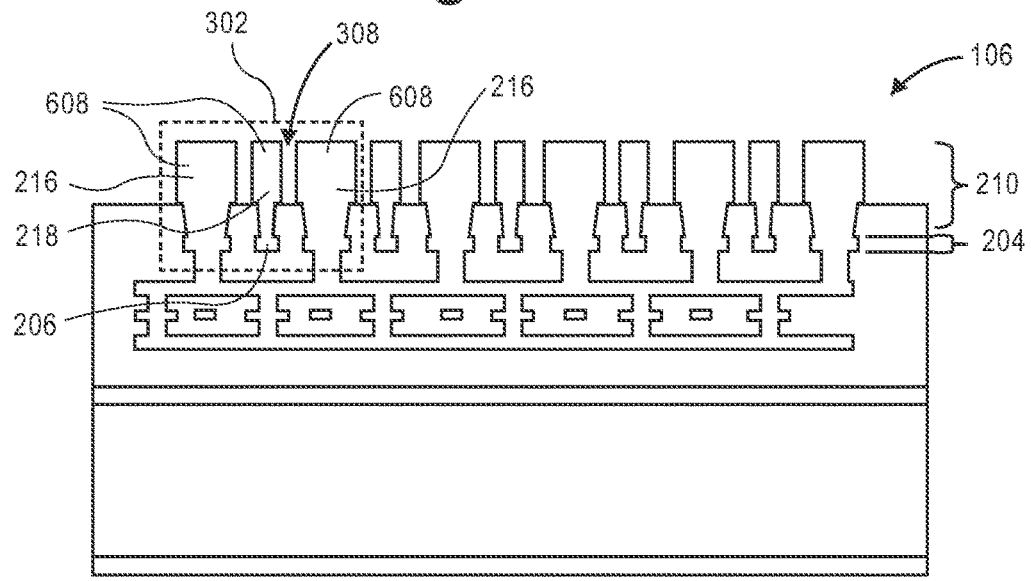

Referring to FIG. 6C, copper columns 608 may be plated within the vertical channels over respective signal lines 206 to build substrate-side coaxial interconnect 302. The vertical structure may extend upward, and thus, substrate-side coaxial interconnect 302 may extend orthogonal to signal routing layer 204. More particularly, substrate-side coaxial interconnect 302 may extend vertically through substrate-side top layer 210. The plated substrate-side coaxial interconnect 302 may include air gaps between respective conductors, e.g., within gap 308 between central conductors 218 and shield conductors 216.

Figure 6D:
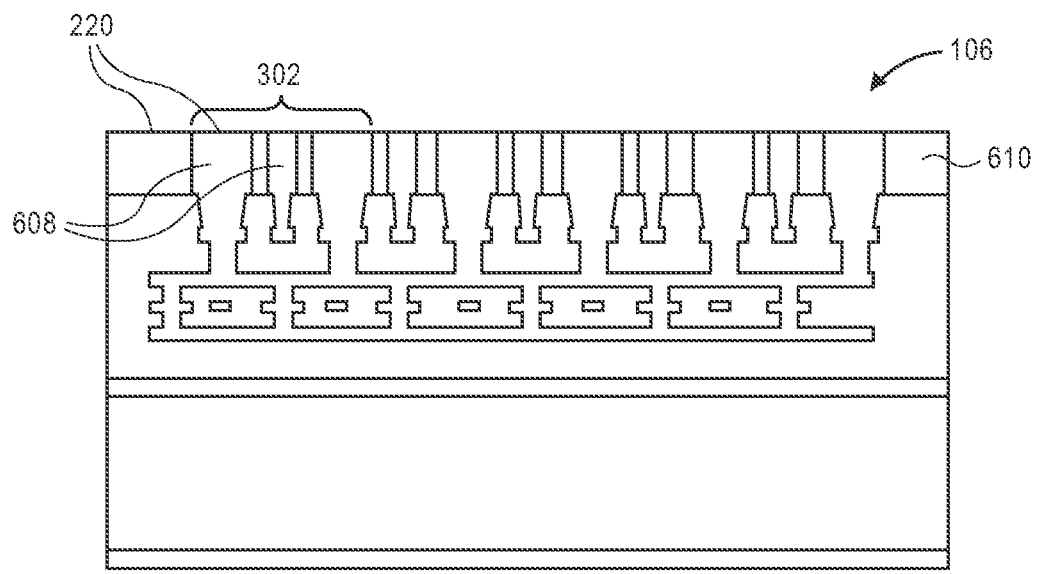

At operation 504, gap 308 is filled with a substrate-side signal insulation material 310. The substrate-side signal insulation material 310 may be the same or different signal insulation material 310 as used in die-side coaxial interconnect 402. Referring to FIG. 6D, in an embodiment, a buildup layer 610 is laminated over top surface 220. Top surface 220 may include a top surface of copper columns 608. Buildup layer 610 may be formed from, e.g., ABF buildup film. Buildup layer 610 may be planarized such that top surface 220 of package substrate 106 extends across coplanar surfaces of copper columns 608 and buildup layer 610. Accordingly, planarization can reveal the top surface of the underlying substrate-side coaxial interconnect 302.

Figure 6E:
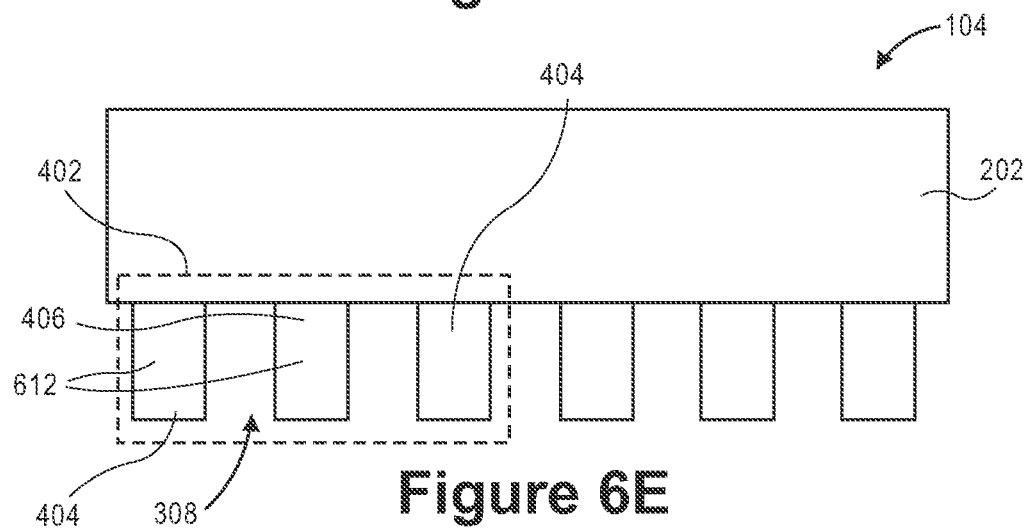
Figure 6F:
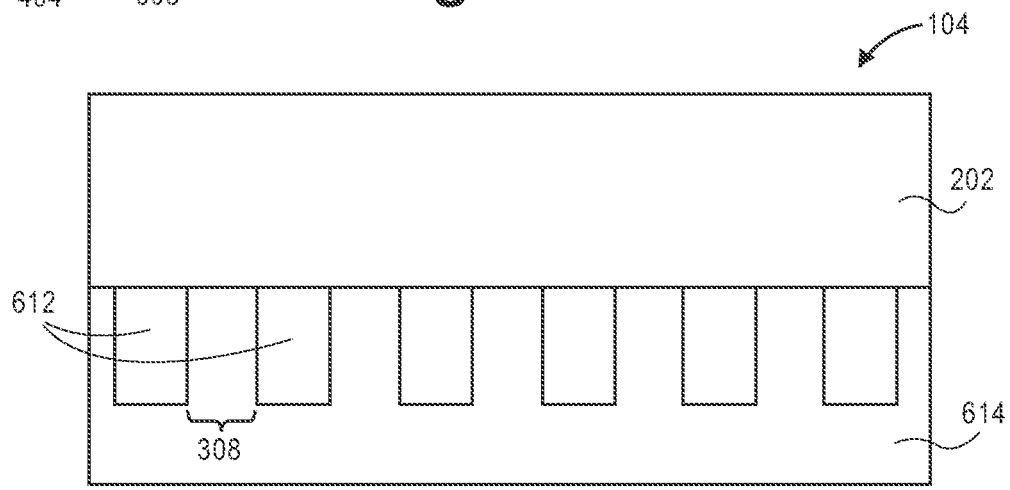
Figure 6G:
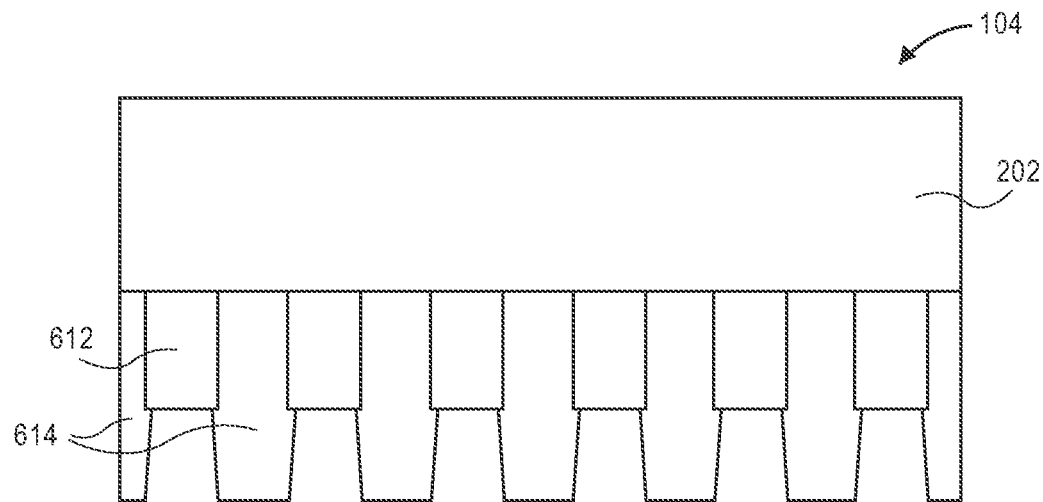
Figure 6H:
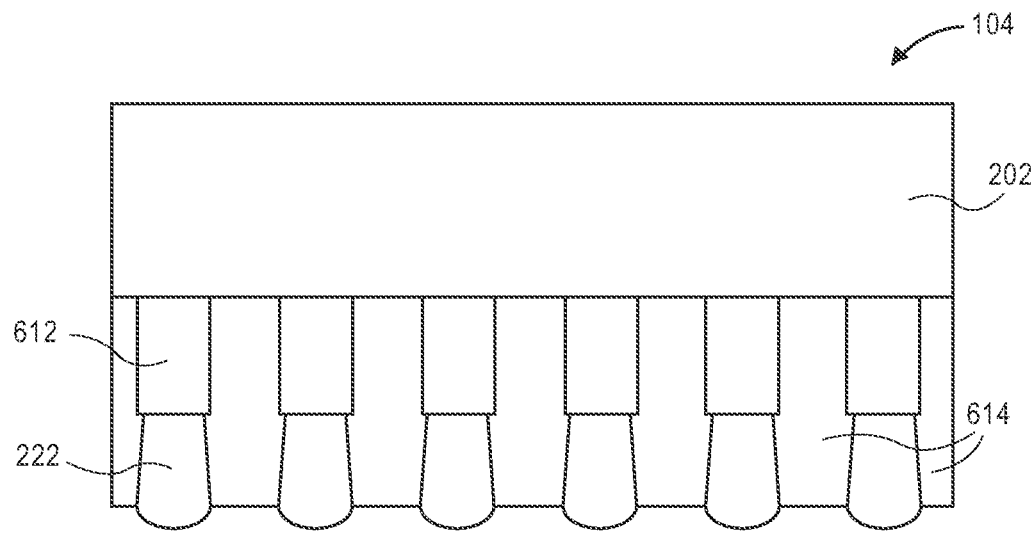

At operation 506, die 104 having die-side coaxial interconnect 402 is formed. Referring to FIG. 6E, die-side coaxial interconnect 402 can extend orthogonal to semiconductor layer 202 of die 104. Operation 506 can be realized using numerous sub-operations, several of which are illustrated in FIGS. 6E-6H.

Referring to FIG. 6E, several copper pillars 612 can be formed on semiconductor layer 202 of die 104. Copper pillars 612 may be formed to match corresponding conductors on the substrate-side. For example, copper pillars 612 may be annular to match a shield conductor 216, or copper pillar 612 may be cylindrical to match a central conductor 218. Thus, die-side copper pillars 612 can have a same coaxial architecture as substrate-side coaxial interconnect 302.

At operation 508, the gap 308 between die-side central conductor 406 and die-side shield conductor 404 of die-side coaxial interconnect 402 may be filled. Referring to FIG. 6F, an underfill layer 614 can be laminated over copper pillars 612 of die 104 that form a portion of die-side coaxial interconnect 402. The underfill material may be cured to encapsulate copper pillars 612. Accordingly, the gap 308 and the coaxial architecture may be filled by die-side signal insulation material 310. In an embodiment, die-side signal insulation material 310 is an underfill material, e.g., an insulating adhesive, and thus differs from substrate-side signal insulation material 310, which is a buildup film as described above. Referring to FIG. 6G, holes can be drilled through underfill layer 614 to expose the underlying copper pillars 612.

At operation 510, solder bump 222 may be deposited on one or more of die-side coaxial interconnect 402 or substrate-side coaxial interconnect 302. Referring to FIG. 6H, solder material may be printed in the holes within underfill layer 614 to form solder bump 222 extending vertically away from copper pillars 612. Alternatively, solder bump 222 may be deposited on copper columns 608 at top surface 220 of package substrate 106. In either case, solder bumps 222 may have a coaxial structure matching an underlying structure of, e.g., copper pillars 612 or copper columns 608. Thus, the combined structures of copper pillars 612, solder bump 222, and copper columns 608 may form coaxial interconnect 212. Deposition of solder bump 222 may be through ball placement and reflow, as is known in the art. Deposition of solder bump 222 may be through a solder paste printing process, as is known in the art.

At operation 512, die 104 may be mounted on package substrate 106. Substrate-side coaxial interconnect 302 may be joined to die-side coaxial interconnect 402. For example, as shown in FIG. 2, die-side coaxial interconnect 402 can be aligned to substrate-side coaxial interconnect 302 such that solder bumps 222 extend between copper columns 608 on the substrate-side and copper pillars 612 on the die-side. A solder reflow process may be used to attach substrate-side coaxial interconnect 302 to die-side coaxial interconnect 402 by a solder bond. Accordingly, matching shield connectors can be electrically connected to each other and matching central conductors 218 can be electrically connected to each other. More particularly, joining die-side coaxial interconnect 402 to substrate-side coaxial interconnect 302 can include joining substrate-side central conductor 306 to die-side central conductor 406, and joining substrate-side shield conductor 304 to die-side shield conductor 404.

The method of manufacturing described above may generally be referred to as a solder-on-die process because solder bumps 222 are illustrated as being deposited on die-side coaxial interconnect 402 prior to the joining operation. As noted above, however, solder may be deposited on substrate-side coaxial interconnect 302 in a process that can be referred to as a solder-on-package process.

Figure 7:
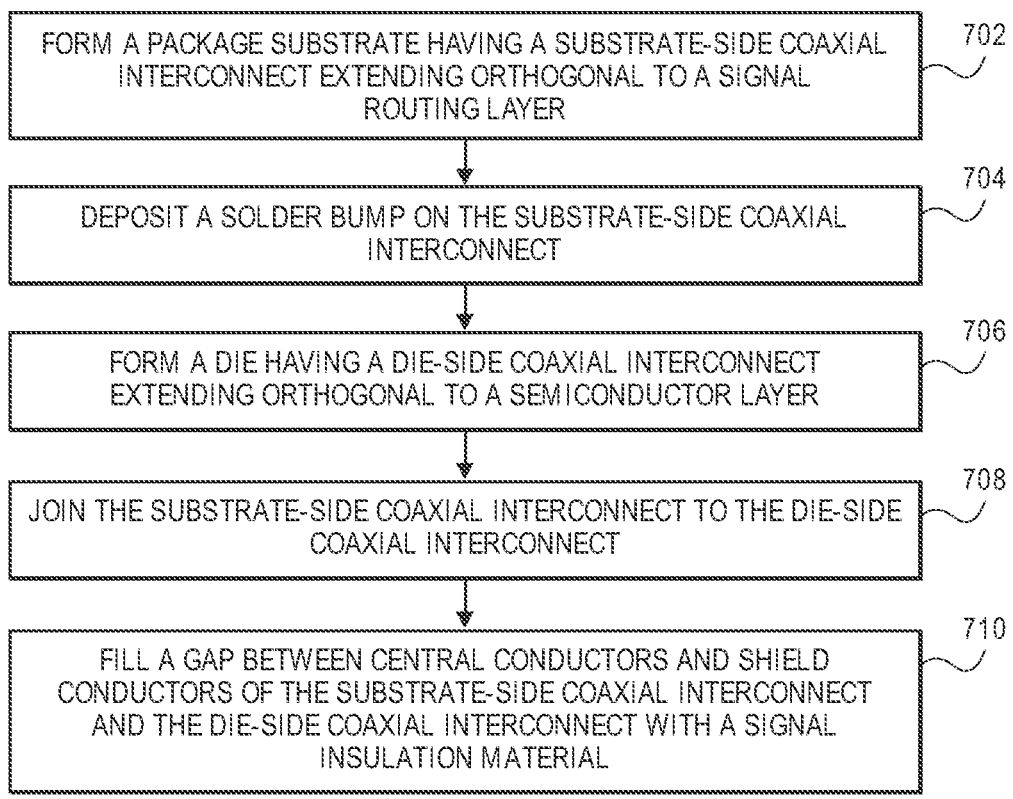
FIG. 7 illustrates a method of manufacturing a semiconductor package having a coaxial interconnect in an FLI portion, in accordance with an embodiment.
Figure 8A:
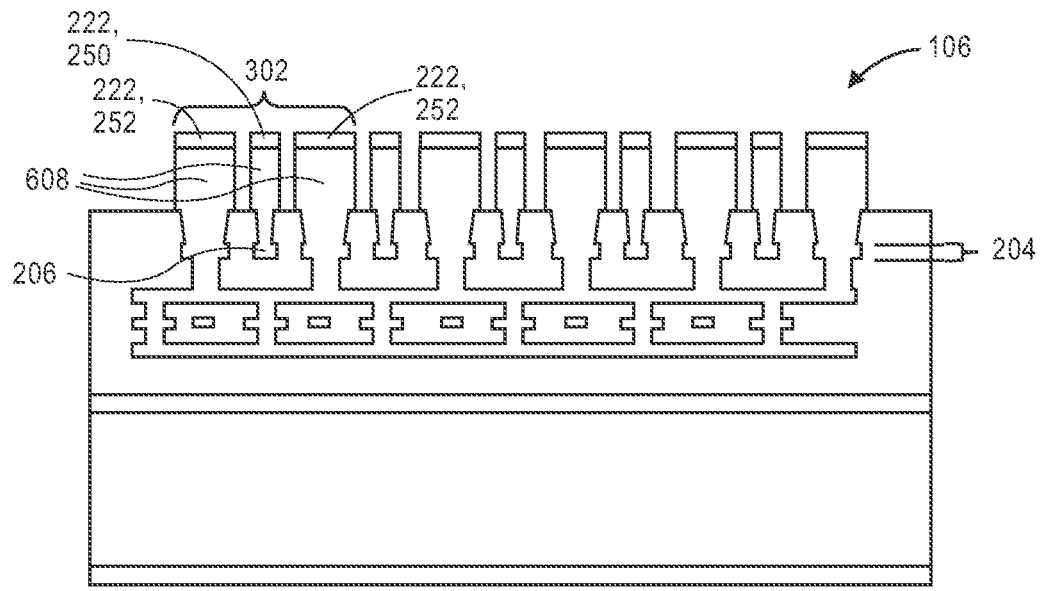
FIGS. 8A-8C illustrate operations in a method of manufacturing a semiconductor package having a coaxial interconnect in an FLI portion, in accordance with an embodiment.
Figure 8B:
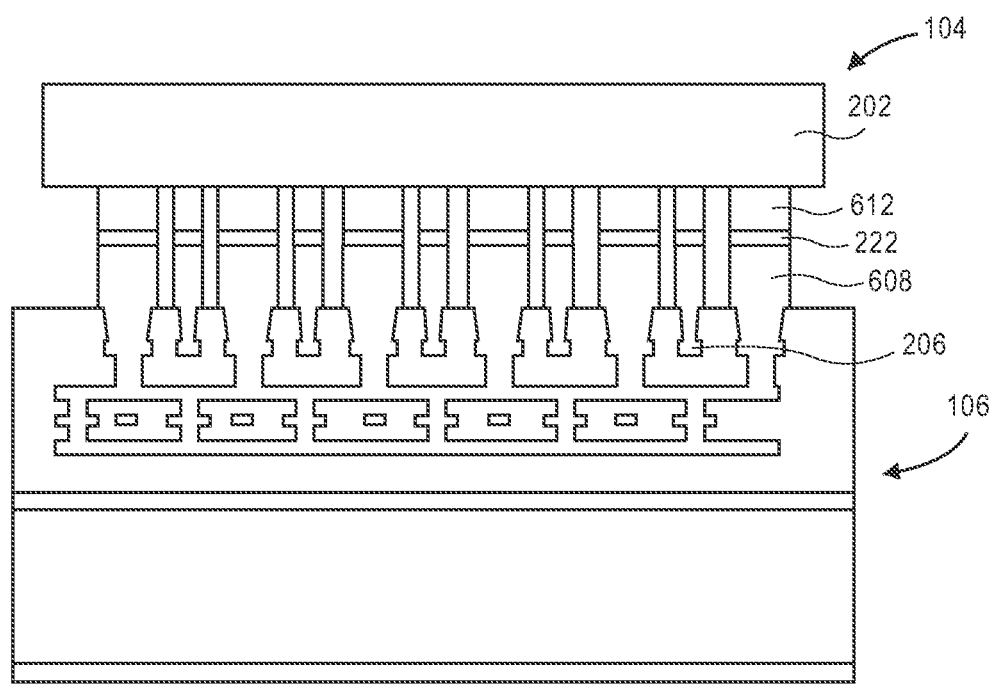
Figure 8C:
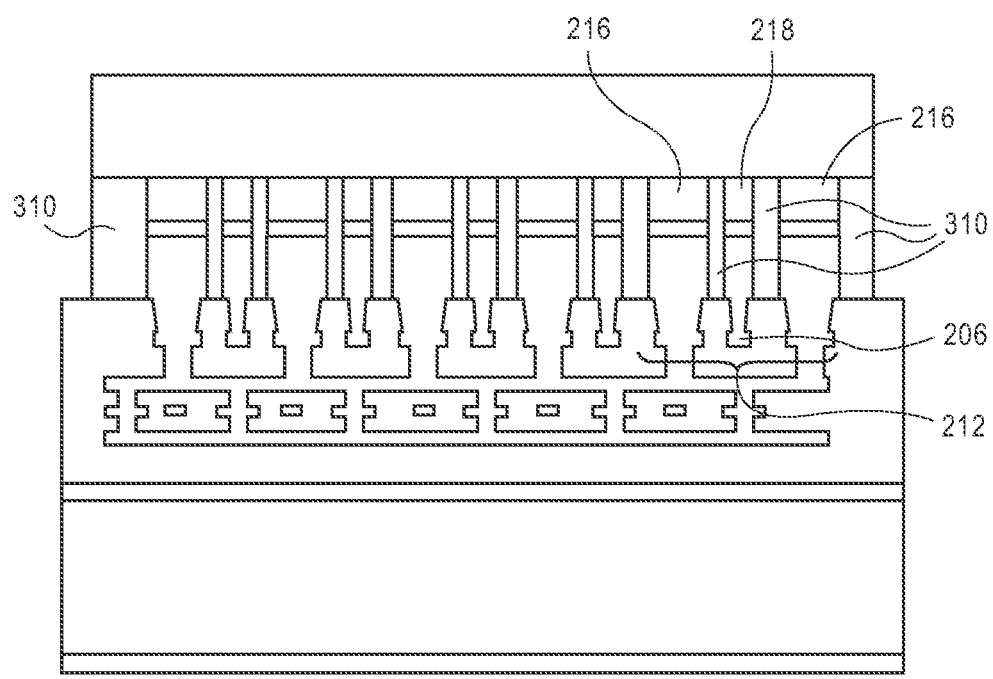

Referring to FIG. 7, a method of manufacturing a semiconductor package having a coaxial interconnect in an FLI portion is shown in accordance with an embodiment. FIGS. 8A-8C illustrate operations in the method of FIG. 7. Accordingly, FIGS. 7-8C are described in combination below.

At operation 702, package substrate 106 may be formed to have substrate-side coaxial interconnect 302 extending orthogonal to signal routing layer 204. Referring to FIG. 8A, the structure formed at operation 702 may be the same as the structure formed at operation 502 in FIG. 5 via the sub-operations illustrated in FIG. 6C. Still referring to FIG. 8A, at operation 704, solder bump 222 may be deposited on substrate-side coaxial interconnect 302. Solder bump 222 regions corresponding to central solder joint 250 and shield solder joint 252 may be plated on top surfaces of copper columns 608. For example, copper and tin solder material may be plated on the coaxial interconnect regions. Thus, solder deposition may be performed by plating (FIG. 8A) rather than printing (FIG. 6H).

At operation 706, die 104 may be formed to have die-side coaxial interconnect 402 extending orthogonal to semiconductor layer 202. The sub-operations of operation 706 can be the same as those shown and described with respect to FIG. 6E. Accordingly, die 104 may include copper pillars 612 extending downward from semiconductor layer 202.

At operation 708, substrate-side coaxial interconnect 302 may be joined to die-side coaxial interconnect 402. Referring to FIG. 8B, copper pillars 612 of die 104 may be aligned to copper columns 608 of package substrate 106. The aligned coaxial interconnect segments may be pressed together. More particularly, copper pillars 612 may be pressed against solder bumps 222 previously deposited on copper columns 608 of package substrate 106. A solder reflow process may be used to join the coaxial interconnects 212 segments by a solder bond. The joining operation may not be limited to a solder joint. That is, in an embodiment, die-side coaxial interconnect 402 and substrate-side coaxial interconnect 302 include respective copper pillars 612 and/or columns 608 that may be joined to each other using direct copper-to-copper bonding processes. That is, there may be no intervening solder material in the coaxial interconnect 212 structure.

At operation 710, gap 308 between central conductors 218 and shield conductors 216 of the coaxial interconnects 212 segments may be filled with signal insulation material 310. In an embodiment, signal insulation material 310 is a liquid ABF encapsulation material, or a low-loss underfill material. For example, signal insulation material 310 can be an underfill material that is flowed into the spaces between coaxial interconnects 212 and between central conductors 218 and shield conductors 216 of coaxial interconnects 212. The underfill material may be flowed before or after joining the coaxial interconnects 212. For example, gap 308 may be filled with underfill material prior to pressing copper pillars 612 of die 104 against solder bumps 222 of package substrate 106. Accordingly, gap 308 may be filled before joining coaxial interconnects 212, or gap 308 may be filled after joining coaxial interconnects 212. This flexibility in embodiments is also evident with respect to sub-operations 508 and 512 of FIG. 5, which indicate that gap 308 is filled by signal insulation material 310 prior to joining the coaxial interconnects 212. Signal insulation material 310 may be cured to complete the encapsulation and shielding of coaxial interconnect 212.

Figure 9:
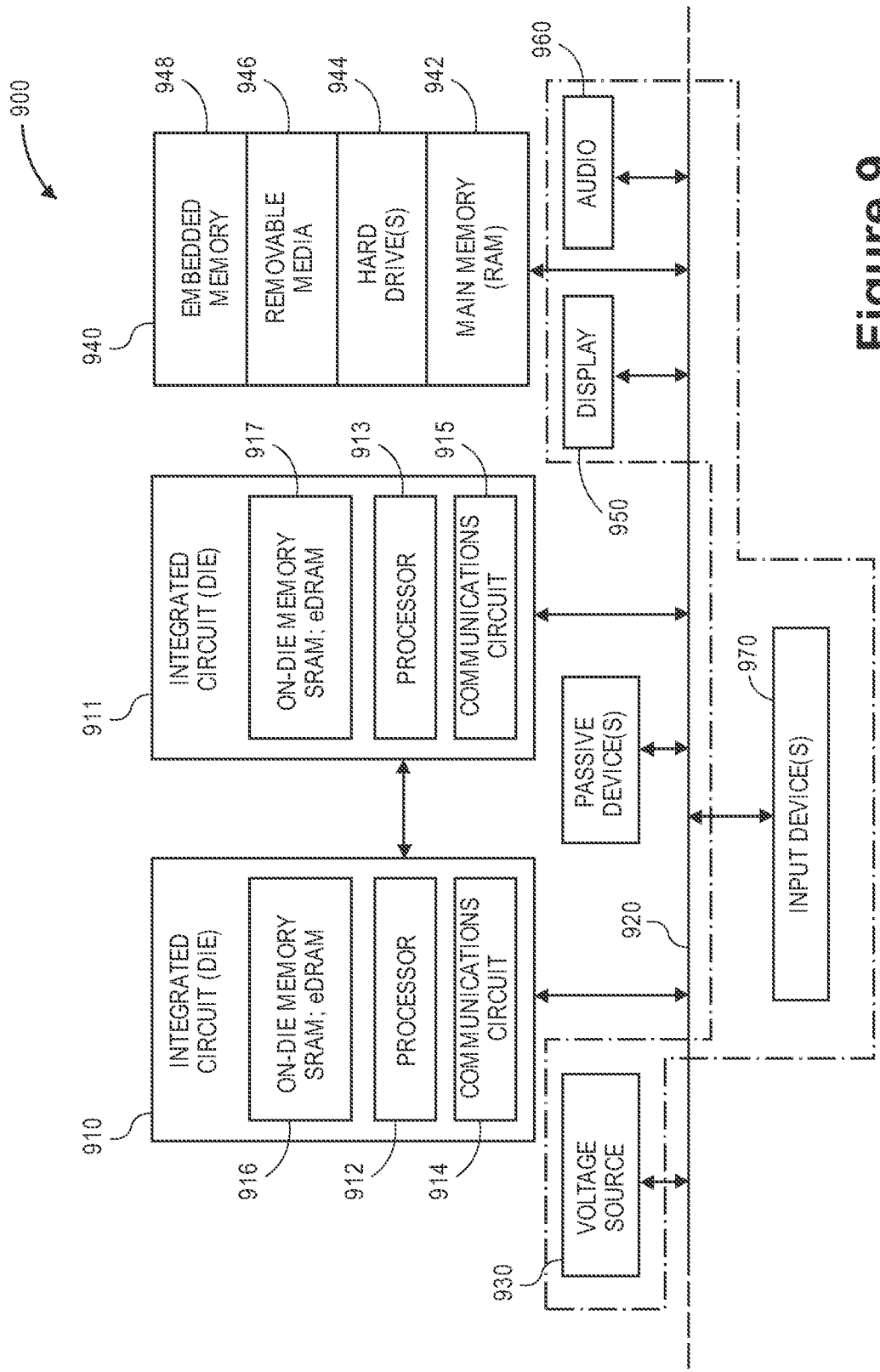
FIG. 9 is a schematic of a computer system, in accordance with an embodiment.

FIG. 9 is a schematic of a computer system, in accordance with an embodiment. The computer system 900 (also referred to as the electronic system 900) as depicted can embody a semiconductor package having a first layer interconnect portion that includes a coaxial interconnect between a die and a package substrate as described according to any of the several disclosed embodiments and their equivalents as set forth in this disclosure. The computer system 900 may be a mobile device such as a netbook computer. The computer system 900 may be a mobile device such as a wireless smart phone. The computer system 900 may be a desktop computer. The computer system 900 may be a hand-held reader. The computer system 900 may be a server system. The computer system 900 may be a supercomputer or high-performance computing system.

In an embodiment, the electronic system 900 is a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. In some embodiments, the voltage source 930 supplies current to the integrated circuit 910 through the system bus 920.

The integrated circuit 910 is electrically coupled to the system bus 920 and includes any circuit, or combination of circuits according to an embodiment. In an embodiment, the integrated circuit 910 includes a processor 912 that can be of any type. As used herein, the processor 912 may mean any type of circuit such as, but not limited to, a microprocessor, a microcontroller, a graphics processor, a digital signal processor, or another processor. In an embodiment, the processor 912 includes, or is coupled with, a semiconductor package having a first layer interconnect portion that includes a coaxial interconnect between a die and a package substrate, as disclosed herein. In an embodiment, SRAM embodiments are found in memory caches of the processor. Other types of circuits that can be included in the integrated circuit 910 are a custom circuit or an application-specific integrated circuit (ASIC), such as a communications circuit 914 for use in wireless devices such as cellular telephones, smart phones, pagers, portable computers, two-way radios, and similar electronic systems, or a communications circuit for servers. In an embodiment, the integrated circuit 910 includes on-die memory 916 such as static random-access memory (SRAM). In an embodiment, the integrated circuit 910 includes embedded on-die memory 916 such as embedded dynamic random-access memory (eDRAM).

In an embodiment, the integrated circuit 910 is complemented with a subsequent integrated circuit 911. Useful embodiments include a dual processor 913 and a dual communications circuit 915 and dual on-die memory 917 such as SRAM. In an embodiment, the dual integrated circuit 911 includes embedded on-die memory 917 such as eDRAM.

In an embodiment, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital variable disks (DVDs), flash memory drives, and other removable media known in the art. The external memory 940 may also be embedded memory 948 such as the first die in a die stack, according to an embodiment.

In an embodiment, the electronic system 900 also includes a display device 950, and an audio output 960. In an embodiment, the electronic system 900 includes an input device such as a controller 970 that may be a keyboard, mouse, trackball, game controller, microphone, voice-recognition device, or any other input device that inputs information into the electronic system 900. In an embodiment, an input device 970 is a camera. In an embodiment, an input device 970 is a digital sound recorder. In an embodiment, an input device 970 is a camera and a digital sound recorder.

As shown herein, the integrated circuit 910 can be implemented in a number of different embodiments, including a semiconductor package having a first layer interconnect portion that includes a coaxial interconnect between a die and a package substrate, according to any of the several disclosed embodiments and their equivalents, an electronic system, a computer system, one or more methods of fabricating an integrated circuit, and one or more methods of fabricating an electronic assembly that includes a semiconductor package having a first layer interconnect portion that includes a coaxial interconnect between a die and a package substrate, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor packages having first layer interconnect portions that include coaxial interconnects between a die and a package substrate embodiments and their equivalents. A foundation substrate may be included, as represented by the dashed line of FIG. 9. Passive devices may also be included, as is also depicted in FIG. 9.

Embodiments of semiconductor packages having a first layer interconnect portion that includes a coaxial interconnect between a die and a package substrate are described above. In an embodiment, a package substrate includes a dielectric layer. The package substrate includes a signal routing layer including a signal line extending laterally over the dielectric layer. The package substrate includes a top layer over the signal routing layer. The top layer includes a coaxial interconnect having a shield conductor surrounding a central conductor. The central conductor is electrically connected to the signal line.

In one embodiment, the central conductor and the shield conductor extend orthogonal to the dielectric layer.

In one embodiment, the central conductor and the shield conductor include respective cross-sectional areas, and the cross-sectional areas are concentric shapes.

In one embodiment, the package substrate includes a signal insulation material between the central conductor and the shield conductor.

In one embodiment, the signal insulation material is one or more of an insulating adhesive, a buildup film, a solder resist film, an epoxy-based material, or an acrylic polymer.

In one embodiment, the package substrate includes a solder bump on a top surface of one or more of the coaxial interconnect or a die mounted on the coaxial interconnect.

In one embodiment, the shield conductor is at a ground potential.

In an embodiment, a semiconductor package includes a package substrate having a top layer over a signal routing layer. The top layer includes a substrate-side coaxial interconnect. The semiconductor package includes a die mounted on the package substrate. The die includes a die-side coaxial interconnect. The die-side coaxial interconnect is coupled to the substrate-side coaxial interconnect.

In one embodiment, the substrate-side coaxial interconnect extends orthogonal to the signal routing layer. The die-side coaxial interconnect extends orthogonal to a semiconductor layer of the die.

In one embodiment, the substrate-side coaxial interconnect includes a substrate-side shield conductor surrounding a substrate-side central conductor. The die-side coaxial interconnect includes a die-side shield conductor surrounding a die-side central conductor. The substrate-side shield conductor is coupled to the die-side shield conductor, and the substrate-side central conductor is coupled to the die-side central conductor.

In one embodiment, the semiconductor package includes a signal insulation material between the central conductors and the shield conductors.

In one embodiment, the signal insulation material is one or more of an insulating adhesive, a buildup film, a solder resist film, an epoxy-based material, or an acrylic polymer.

In one embodiment, the signal insulation material includes a central solder joint between the central conductors, and a shield solder joint between the shield conductors.

In one embodiment, the shield conductors are at a ground potential.

In an embodiment, a method of manufacturing a semiconductor package having a coaxial interconnect in an FLI portion includes forming a package substrate having a top layer over a signal routing layer. The top layer includes a substrate-side coaxial interconnect extending orthogonal to the signal routing layer. The method includes forming a die having a die-side coaxial interconnect extending orthogonal to a semiconductor layer. The method includes joining the substrate-side coaxial interconnect to the die-side coaxial interconnect.

In one embodiment, the method includes depositing a solder bump on one or more of the die-side coaxial interconnect or the substrate-side coaxial interconnect.

In one embodiment, joining the coaxial interconnects includes joining a substrate-side central conductor to a die-side central conductor, and joining a substrate-side shield conductor to a die-side shield conductor.

In one embodiment, the method includes filling a gap between the substrate-side central conductor and the substrate-side shield conductor with a signal insulation material.

In one embodiment, filling the gap is before joining the coaxial interconnects.

In one embodiment, filling the gap is after joining the coaxial interconnects.

The invention claimed is:

1. A package substrate, comprising:
   a dielectric layer;
   a signal routing layer including a signal line extending laterally over the dielectric layer; and
   a top layer over the signal routing layer, wherein the top layer includes a coaxial interconnect having a shield conductor surrounding a central conductor, and wherein the central conductor is electrically connected to the signal line, and wherein the top layer includes a substrate-side signal insulation material laterally surrounding and in contact with the coaxial interconnect.

2. The package substrate of claim 1, wherein the central conductor and the shield conductor extend orthogonal to the dielectric layer.

3. The package substrate of claim 2, wherein the central conductor and the shield conductor include respective cross-sectional areas, and wherein the cross-sectional areas are concentric shapes.

4. The package substrate of claim 3, further comprising a signal insulation material between the central conductor and the shield conductor.

5. The package substrate of claim 4, wherein the signal insulation material is one or more of an insulating adhesive, a buildup film, a solder resist film, an epoxy-based material, or an acrylic polymer.

6. The package substrate of claim 1, further comprising a solder bump on a top surface of one or more of the coaxial interconnect or a die mounted on the coaxial interconnect.

7. The package substrate of claim 1, wherein the shield conductor is at a ground potential.

8. A semiconductor package, comprising:
   a package substrate having a top layer over a signal routing layer, wherein the top layer includes a substrate-side coaxial interconnect, and wherein the top layer includes a substrate-side signal insulation material laterally surrounding and in contact with the substrate-side coaxial interconnect; and
   a die mounted on the package substrate, wherein the die includes a die-side coaxial interconnect, wherein the die-side coaxial interconnect is coupled to the substrate-side coaxial interconnect.

9. The semiconductor package of claim 8, wherein the substrate-side coaxial interconnect extends orthogonal to the signal routing layer, and wherein the die-side coaxial interconnect extends orthogonal to a semiconductor layer of the die.

10. The semiconductor package of claim 9, wherein the substrate-side coaxial interconnect includes a substrate-side shield conductor surrounding a substrate-side central conductor, wherein the die-side coaxial interconnect includes a die-side shield conductor surrounding a die-side central conductor, wherein the substrate-side shield conductor is coupled to the die-side shield conductor, and wherein the substrate-side central conductor is coupled to the die-side central conductor.

11. The semiconductor package of claim 10, further comprising a signal insulation material between the central conductors and the shield conductors.

12. The semiconductor package of claim 11, wherein the signal insulation material is one or more of an insulating adhesive, a buildup film, a solder resist film, an epoxy-based material, or an acrylic polymer.

13. The semiconductor package of claim 8, further comprising a central solder joint between the central conductors, and a shield solder joint between the shield conductors.

14. The semiconductor package of claim 8, wherein the shield conductors are at a ground potential.

15. A method, comprising:
    forming a package substrate having a top layer over a signal routing layer, wherein the top layer includes a substrate-side coaxial interconnect extending orthogonal to the signal routing layer, and wherein the top layer includes a substrate-side signal insulation material laterally surrounding and in contact with the substrate-side coaxial interconnect;
    forming a die having a die-side coaxial interconnect extending orthogonal to a semiconductor layer; and
    joining the substrate-side coaxial interconnect to the die-side coaxial interconnect.

16. The method of claim 15 further comprising depositing a solder bump on one or more of the die-side coaxial interconnect or the substrate-side coaxial interconnect.

17. The method of claim 15, wherein joining the coaxial interconnects includes joining a substrate-side central conductor to a die-side central conductor, and joining a substrate-side shield conductor to a die-side shield conductor.

18. The method of claim 17 further comprising filling a gap between the substrate-side central conductor and the substrate-side shield conductor with a signal insulation material.

19. The method of claim 18, wherein filling the gap is before joining the coaxial interconnects.

20. The method of claim 18, wherein filling the gap is after joining the coaxial interconnects.

* * * * *